United States Patent
Nielsen (10) Patent No.: US 12,100,963 B2
(45) Date of Patent: Sep. 24, 2024

(54) METHOD FOR GRID IMPEDANCE AND DYNAMICS ESTIMATION

(71) Applicant: VESTAS WIND SYSTEMS A/S, Aarhus N (DK)

(72) Inventor: Per Hagen Nielsen, Tilst (DK)

(73) Assignee: Vestas Wind Systems A/S, Aarhus N (DK)

( * ) Notice: Subject to any disclaimer, the term of this patent is extended or adjusted under 35 U.S.C. 154(b) by 362 days.

(21) Appl. No.: 17/624,409

(22) PCT Filed: Jun. 19, 2020

(86) PCT No.: PCT/DK2020/050179
§ 371 (c)(1),
(2) Date: Jan. 3, 2022

(87) PCT Pub. No.: WO2021/001002
PCT Pub. Date: Jan. 7, 2021

(65) Prior Publication Data
US 2022/0399721 A1 Dec. 15, 2022

(30) Foreign Application Priority Data
Jul. 3, 2019 (DK) .......................... PA 2019 70433

(51) Int. Cl.
G05B 19/042 (2006.01)
G01R 27/16 (2006.01)
H02J 3/38 (2006.01)

(52) U.S. Cl.
CPC .............. *H02J 3/381* (2013.01); *G01R 27/16* (2013.01); *G05B 19/0428* (2013.01);
(Continued)

(58) Field of Classification Search
CPC ......... H02J 3/0012; H02J 3/001; Y02E 10/72; G01R 27/16; G01R 19/2513; G01R 27/02;
(Continued)

(56) References Cited

U.S. PATENT DOCUMENTS 5,448,167 A * 9/1995 Takagi .................... H02P 9/105
322/29
6,219,591 B1 * 4/2001 Vu ........................ G01R 31/085
700/286
(Continued)

FOREIGN PATENT DOCUMENTS

EP 1841037 A2 10/2007
EP 3361272 A1 8/2018
WO 2021001002 A1 1/2021

OTHER PUBLICATIONS

Cobreces et al., Grid Impedance Monitoring System for Distributed Power Generation Electronic Interfaces, IEEE Transactions on Instrumentation and Measurement, vol. 58, No. 9, Sep. 2009 (Year: 2009).*

(Continued)

*Primary Examiner* — Darrin D Dunn
(74) *Attorney, Agent, or Firm* — Patterson + Sheridan, LLP (57) ABSTRACT

Estimating components of a grid impedance, Z, of a power grid being coupled to a power generating unit at a point of interconnection is disclosed. A voltage, Vmeas, across the point of interconnection; an active current, IP, and/or an active power, P, delivered by the power generating unit to the power grid; and a reactive current, IQ, and/or a reactive power, Q, delivered by the power generating unit are determined. A parameter estimation vector is estimated using a recursive adaptive filter algorithm, and on the basis of Vmeas, IP, P, IQ and/or Q. A model representation of the
(Continued)

power grid is created on the basis of the parameter estimation vector, and a system DC gain vector for the power grid is calculated, using the model representation. Finally, Z, and/or a resistance, R, of Z, and/or a reactance, X, of Z, is derived from the system DC gain vector.

15 Claims, 4 Drawing Sheets

(52) U.S. Cl.
CPC ............... *G05B 2219/2619* (2013.01); *G05B 2219/2639* (2013.01); *H02J 2203/20* (2020.01); *H02J 2300/28* (2020.01)

(58) Field of Classification Search
CPC .. G01R 21/001; G01R 21/1271; G05B 17/02; G05B 2219/2639; G05B 11/01; G05B 13/042; G05B 2219/2619; G05B 23/0254
See application file for complete search history.

(56) References Cited

U.S. PATENT DOCUMENTS

| | | | | |
|---|---|---|---|---|
| 9,859,710 | B2* | 1/2018 | Garcia | H02J 3/48 |
| 11,146,103 | B1* | 10/2021 | Davies | G06F 9/4401 |
| 2007/0233406 | A1* | 10/2007 | Delmerico | G01R 19/2513 702/65 |
| 2008/0204054 | A1* | 8/2008 | Wells | G01R 27/16 324/713 |
| 2008/0258836 | A1* | 10/2008 | Kim | H03H 7/40 333/17.3 |
| 2012/0211983 | A1* | 8/2012 | Tripathi | H02P 9/12 290/44 |
| 2013/0116841 | A1* | 5/2013 | Garcia | H02J 3/1878 700/287 |
| 2015/0025860 | A1* | 1/2015 | Andresen | G01R 27/16 703/2 |
| 2016/0047851 | A1* | 2/2016 | Andresen | G01R 27/16 702/65 |
| 2017/0122991 | A1* | 5/2017 | Aki | G01R 27/16 |
| 2019/0131795 | A1* | 5/2019 | Gadiraju | F03D 7/0284 |
| 2019/0334352 | A1* | 10/2019 | Sugimoto | H02M 7/48 |
| 2019/0339320 | A1* | 11/2019 | Dzafic | G01R 31/085 |
| 2020/0041548 | A1* | 2/2020 | Deng | H02J 3/00 |
| 2020/0081040 | A1* | 3/2020 | Miao | G01R 19/2513 |
| 2020/0212709 | A1* | 7/2020 | de Callafon | H02J 3/0012 |
| 2021/0313832 | A1* | 10/2021 | Parchure | G01R 19/2513 |
| 2021/0313833 | A1* | 10/2021 | Herbst | H02J 13/00002 |
| 2021/0397762 | A1* | 12/2021 | Miao | H02J 13/00006 |
| 2022/0399721 | A1* | 12/2022 | Nielsen | G01R 27/16 |
| 2023/0417220 | A1* | 12/2023 | Abeyasekera | H02J 3/381 |
| 2024/0003333 | A1* | 1/2024 | Nielsen | H02J 3/381 |
| 2024/0003987 | A1* | 1/2024 | Giuntoli | H02J 13/00002 |

OTHER PUBLICATIONS

Borkowski Dariusz, "Power system impedance tracking using sliding, finite memory complex recursive least squares", 2013 Signal Processing: Algorithms, Architectures, Arrangements, and Applications (SPA), Poznan Univ of Technology, Dated Sep. 26, 2013, pp. 78-81.

Hoffmann Nils et al: "Minimal Invasive Equivalent Grid Impedance Estimation in Inductive-Resistive Power Networks Using Extended Kalman Fi", IEEE Transactions on Power Electronics, Institute of Electrical and Electronics Engineers, USA, vol. 29, No. 2, Dated Feb. 1, 2014, pp. 631-641.

A-R Yasser et al: "Natural Adaptive Observers-Based Estimation Unite for Robust Grid-Voltage Sensor-less Control Characteristics in Inverter-Based DG Units", Power Engineering Society General Meeting, 2007. IEEE, IEEE, PI, Dated Jun. 1, 2007, pp. 1-8.

PCT, Notification of Transmittal of the International Search Report and the Written Opinion of the International Searching Authority, or the Declaration for Application PCT/DK2020/050179 dated Sep. 15, 2020.

Danish Patent and Trademark Office, 1st Technical Examination including the Search Report and Search Opinion of Patent Application OA 2019 70433 dated Dec. 17, 2019.

Cobreces et al., "Complex-space recursive least squares power system identification," 2007 IEEE Power Electronics Specialists Conference, Orlando, FL, 2007, pp. 2478-2484.

Timbus et al., "Line Impedance Estimation Using Active and Reactive Power Variations," 2007 IEEE Power Electronics Specialists Conference, Orlando, FL, 2007, pp. 1273-1279.

European Patent Office, Communication pursuant to Article 94(3) EPC for European Patent Application No. 20740531.7, dated Mar. 13, 2024.

* cited by examiner

METHOD FOR GRID IMPEDANCE AND DYNAMICS ESTIMATION

FIELD OF THE INVENTION

The present invention relates to a method for estimating components of a grid impedance. Furthermore, the present invention relates to an apparatus for controlling a power feed into a power grid based on estimated components of the grid impedance.

BACKGROUND OF THE INVENTION

Power grids are reliant on power feed from power generating units. The amount of power feed required by a power grid is determined by the grid impedance, thus the grid impedance determines the amount of active and reactive power fed into the power grid. Methods for estimating grid impedances are known in the art, for example the grid impedance may be estimated by a Thévenin equivalent model of a power grid. However, the Thévenin's theorem only holds for linear electrical networks. Furthermore, the grid impedance of a power grid tends to vary over time due to changes in the power grid, and thus may have to be recalculated.

US 2015/0025860 discloses a method for estimating grid properties of a power grid coupled to a generator at a point of common coupling. The grid properties are estimated by a grid model using as input parameters the voltage, current and phase angle between the voltage and current at the point of common coupling. The input parameters are used in an equation which is solved for at least three different working points.

EP 2 688 172 discloses a method for controlling operation of a power system. The method measures changes in a measured local voltage when reactive power is injected into the power system to increase the system voltage or absorbed from the power system to decrease the system voltage. Thereby the change in local voltage as a result of a change in reactive power generation or absorption is an indication of the system impedance and thus also allows calculation of the short circuit ratio (SCR).

EP 1 841 037 A2 discloses a method for determining parameter values associated with an electrical grid. The electrical grid has a point of interconnection where the electrical grid is electrically coupled to a power source. The method includes measuring real power and reactive power at the point of interconnection of the electrical grid to obtain a plurality of real power values and a plurality of reactive power values. The method further includes measuring a voltage at the point of interconnection to obtain a plurality of voltage values. At least one parameter value associated with the electrical grid is estimated utilizing the plurality of real power values, the plurality of reactive power values, and the plurality of voltage values, and a mathematical estimation technique.

DESCRIPTION OF THE INVENTION

It is an object of embodiments of the invention to provide a method for estimating a grid impedance of a power grid in an easy and fast manner.

It is a further object of embodiments of the invention to provide a renewable power plant which is capable of providing a power feed to a power grid which is more precise than similar prior art renewable power plants.

It is a further object of embodiments of the invention to provide a renewable power plant which is capable of adapting a power feed to a power grid according to changes of a grid impedance.

According to a first aspect the invention provides a method for estimating components of a grid impedance, Z, of a power grid coupled to a power generating unit at a point of interconnection, the method comprising the steps of:

determining a voltage, $V_{meas}$, across the point of interconnection; an active current, $I_P$, and/or an active power, P, delivered by the power generating unit to the power grid; and a reactive current, $I_Q$, and/or a reactive power, Q, delivered by the power generating unit to the power grid, estimating a parameter estimation vector using a recursive adaptive filter algorithm, and on the basis of the determined voltage, $V_{meas}$, and the determined active current, $I_P$, and/or active power, P; and the reactive current, $I_Q$, and/or the reactive power, Q, the parameter estimation vector defining a set of estimated model parameters for a selected model of system response of the power grid, creating a model representation of the power grid on the basis of the parameter estimation vector, and by applying the set of parameters of the parameter estimation vector to the selected model, calculating a system DC gain vector for the power grid, using the model representation, the DC gain vector representing a correlation between voltage, $V_{meas}$, on the one hand, and active current, $I_P$, and/or active power, P; and reactive current, $I_Q$, and/or reactive power, Q, on the other hand, at steady state of the power grid, and deriving the grid impedance, Z, and/or a resistance, R, of the grid impedance, Z, and/or a reactance, X, of the grid impedance, Z, from the system DC gain vector, where $Z=R+jX$.

Thus, according to the first aspect, the invention provides a method for estimating components of a grid impedance, Z, of a power grid. In the present context the term 'power grid' should be interpreted to mean an interconnected electrical network for delivering electrical power from producers to consumers.

The power grid may have different topologies. Examples of such topologies are, e.g., radial power grids and meshed power grids.

The power grid may further have electrical components coupled thereon, i.e. the electrical components may be coupled to the interconnected electrical network. The electrical components could, e.g., be resistive, capacitive and/or inductive. Examples of such electrical components include, but are not limited to, switch gears, transformers or capacitor banks.

The power grid has a grid impedance, Z. The grid impedance, Z, is of the complex form $Z=R+jX$, wherein R is a real part of the complex grid impedance, Z, representing a resistive part of the complex grid impedance, Z. Similarly, X is an imaginary part of the complex grid impedance, Z, representing a reactive part of the complex grid impedance, Z. The imaginary part, X, may be zero, in which case the grid impedance, Z, is purely resistive. Similarly, the real part, R, may be zero, in which case the grid impedance, Z, is purely reactive. As an alternative, the real part, R, as well as the imaginary part, X, may be non-zero, in which case the grid impedance, Z, comprises a resistive part as well as a reactive part.

The power grid is coupled to a power generating unit at a point of interconnection. The point of interconnection may be seen as the physical interface between the power grid and the power generating unit, i.e. the point where the power generating unit is coupled to the interconnected electrical network.

In the present context the term 'power generating unit' should be interpreted to mean a unit which is capable of generating electrical power, and which supplies all or part of the produced power to the power grid. The power generating unit may be a conventional unit, such as a power plant, a combustion engine, etc., or it may be a renewable power generating unit, such as a wind turbine, a photovoltaic cell, etc.

In the method according to the first aspect of the invention, a voltage, $V_{meas}$, across the point of interconnection; an active current, $I_P$, and/or an active power, P, delivered by the power generating unit to the power grid; and a reactive current, $I_Q$, and/or a reactive power, Q, delivered by the power generating unit to the power grid are initially determined.

Thus, initially, a voltage, $V_{meas}$, across the point of interconnection is determined. The voltage, $V_{meas}$, is the voltage across the point between the power grid and the power generating unit, i.e. across the point where the power generating unit is coupled to the power grid. Accordingly, the voltage, $V_{meas}$, is the voltage in front of the power generating unit and towards the power grid.

Furthermore, an active current, $I_P$, and/or an active power, P, is determined. Thus, only the active current, $I_P$, may be determined. Alternatively, only the active power, P, may be determined. As another alternative, the active current, $I_P$, as well as the active power, P, may be determined. The active current, $I_P$, represents an amount of active current, $I_P$, delivered by the power generating unit to the power grid. Similarly, the active power, P, represents an amount of active power delivered by the power generating unit to the power grid. Thus, the active current, $I_P$, as well as the active power, P, represents the active part of the power which the power generating unit provides to the power grid.

Furthermore, a reactive current, $I_Q$, and/or a reactive power, Q, is determined. Thus, only the reactive current, $I_Q$, may be determined. Alternatively, only the reactive power, Q, may be determined. As another alternative, the reactive current, $I_Q$, as well as the reactive power, Q, may be determined. The reactive current, $I_Q$, represents an amount of reactive current, $I_Q$, delivered by the power generating unit to the power grid. Similarly, the reactive power, Q, represents an amount of reactive power delivered by the power generating unit to the power grid. Thus, the reactive current, $I_Q$, as well as the reactive power, Q, represents the reactive part of the power which the power generating unit provides to the power grid.

Thus, by determining the voltage, $V_{meas}$, the active current, $I_P$, and/or the active power, P, and the reactive current, $I_Q$, and/or the reactive power, Q, information has been obtained about the voltage across the point of interconnection, about the active part of the power delivered by the power generating unit to the power grid, and about the reactive part of the power delivered by the power generating unit to the power grid.

The determination of the voltage, $V_{meas}$, $I_P$ and/or P and $I_Q$ and/or Q, may, e.g., be performed by direct measurements. The direct measurements may, e.g., be performed by means of power meters. As an alternative, the voltage, $V_{meas}$, the active current, $I_P$, and/or the active power, P, and the reactive current, $I_Q$, and/or the reactive power, Q, may be derived from other parameters, which could be measured. For instance, knowing the voltage, $V_{meas}$, and the reactive power, Q, it is possible to derive the reactive current, $I_Q$.

Next, a parameter estimation vector is estimated, using a recursive adaptive filter algorithm, and on the basis of the determined voltage, $V_{meas}$, and the determined active current, $I_P$, and/or active power, P; and the determined reactive current, $I_Q$, and/or reactive power, Q. Since the parameter estimation vector is estimated on the basis of the voltage and current and/or power parameters, which were determined previously, the resulting parameter estimation vector depends on these parameters, and therefore changes in voltage and current and/or power parameters will be reflected in the estimated parameter estimation vector.

The parameter estimation vector defines a set of estimated model parameters for a selected model of system response of the power grid. Thus, a model is selected which reflects how the power grid is expected to react in response to changes in voltage, active power and/or reactive power. Thus, the selected model takes general consideration regarding the power grid and the power generating unit into account, and the selected model may be regarded as a 'type' of model. However, the exact system response of the actual power grid is determined by the set of model parameters which needs to be applied to the selected model. According to the present invention, these model parameters are estimated in the form of the parameter estimation vector.

In the present context, the term 'recursive adaptive filter algorithm' should be interpreted to mean a filter that has a space state model controlled by variable parameters and adjusts those parameters according to an optimisation algorithm. This will be described in further detail below.

Next, a model representation of the power grid is created on the basis of the parameter estimation vector, and by applying the set of parameters of the parameter estimation vector to the selected model. Since the model representation of the power grid is created on the basis of the parameter estimation vector, the resulting model representation depends on parameter estimation vector, and thereby on changes in voltage and current and/or power parameters which formed the basis of the parameter estimation vector. More particularly, the set of parameters, which were identified when estimating the estimation vector, are applied to the selected model. Thereby the resulting model representation, based on the selected model and including the applied set of parameters, reflects the actual behaviour of the actual system under the actual prevailing circumstances.

The model representation of the power grid may be a state space representation, and may be of the following mathematical form $$\dot{x}(t) = Ax(t)Bu(t)$$

$$y(t) = Cx(t) + Du(t), D = 0$$

⇓

$$\begin{bmatrix} \dot{x}_1(t) \\ \dot{x}_2(t) \end{bmatrix} = \begin{bmatrix} a1 & a2 \\ a3 & a4 \end{bmatrix} \begin{bmatrix} x_1(t) \\ x_2(t) \end{bmatrix} + \begin{bmatrix} b1 & b2 \\ b3 & b4 \end{bmatrix} \begin{bmatrix} I_P(t) \\ I_Q(t) \end{bmatrix}$$

$$y(t) = \begin{bmatrix} c1 & c2 \end{bmatrix} \begin{bmatrix} x_1(t) \\ x_2(t) \end{bmatrix}, y(t) = V_Z(t) + V_{dyn}(t).$$

The state space representation will be described in further detail below.

Next, a system DC gain vector for the power grid is calculated, using the model representation. As the system DC gain vector for the power grid is calculated using the model representation, the calculated system DC gain vector depends on the model representation. Therefore, changes in the model representation will be reflected in the calculated system DC gain vector. Accordingly, changes in the determined voltage, current and/or power parameters are also reflected in the DC gain vector.

The DC gain vector represents a correlation between voltage, $V_{meas}$, on the one hand, and active current, $I_P$, and/or active power, P; and reactive current, $I_Q$, and/or reactive power, Q, on the other hand, at steady state of the power grid. This is due to the fact that the parameters of the estimation vector, which are applied to the selected model in order to create the model representation, are estimated on the basis of the voltage, $V_{meas}$, the information regarding the active power and the information regarding the reactive power. Each vector element of the DC gain vector may be a gain scalar value to each input, $I_p$ and $I_q$, forming the output, $V_{meas}$, at steady state.

In the present context the term 'steady state of the power grid' should be interpreted to mean a state of the power grid in which dynamic effects, e.g. caused by changes in the system, have been attenuated, i.e. a state with essentially no dynamics. Accordingly, the calculated DC gain vector reflects how the voltage, $V_{meas}$, reacts to changes in active power and/or reactive power, when dynamic effects are not taken into account. However, according to the invention, the DC gain is calculated even though dynamic effects are in fact present.

The system DC gain vector may be calculated using the state space representation described above, and may have the following form $$K_{DC}=D-CA^{-1}B.$$

Finally, the grid impedance, Z, and/or a resistance, R, of the grid impedance, Z, and/or a reactance, X, of the grid impedance, Z, from the system DC gain vector, where Z=R+jX, is derived. Since the DC gain vector represents a correlation between voltage, active power and reactive power at steady state of the power grid, it is a suitable measure for the grid impedance, Z, since the grid impedance, Z, is also related to the steady state of the power grid.

The derivation may be performed by calculating and/or solving the system DC gain vector. Since the grid impedance, Z, and/or a resistance, R, of the grid impedance, Z, and/or a reactance, X, of the grid impedance, Z, is derived from the system DC gain vector, the derived grid impedance, Z, and/or a resistance, R, of the grid impedance, Z, and/or a reactance, X, of the grid impedance, Z, depends on the calculated system DC gain vector. For this reason, any changes in the calculated system DC gain vector and in the determined voltage, current and/or power parameters will be reflected in the derived grid impedance, Z, and/or a resistance, R, of the grid impedance, Z, and/or a reactance, X, of the grid impedance, Z.

The system DC gain vector may be in the form described above, and may thus be derived in the following manner $$V_{Z-DC} = [K_{DC}1 \ K_{DC}2]\begin{bmatrix} I_P(t) \\ I_Q(t) \end{bmatrix} = V_{Z-DC} = [R \ X]\begin{bmatrix} I_P(t) \\ I_Q(t) \end{bmatrix}$$

$$\Downarrow$$

$$R = K_{DC}1 \quad X = K_{DC}2.$$

As described above, each vector element of the DC gain vector is, in this case, a gain scalar value to each input, $I_p$ and $I_q$, forming the output, $V_{meas}$, at steady state.

It is an advantage that the estimation of the parameter estimation vector requires few input variables, i.e. the determined voltage, $V_{meas}$, and the determined active current, $I_P$, and/or active power, P; and the determined reactive current, $I_Q$, and/or reactive power, Q. This allows the estimation method to be simple, because the number of variables to be processed is low. Furthermore, the recursive adaptive filter algorithm offers a precise and reliable estimation of the parameter estimation vector, and thereby of the parameters required for providing an accurate model representation of the power grid. The model representation of the power grid applies the parameters from the estimated parameter estimation vector to the selected model, and hence the created model representation will also be precise. The calculated system DC gain vector using the model representation is an easy manner of representing the grid impedance, Z. Thereby the grid impedance, Z, and/or a resistance, R, of the grid impedance, Z, and/or a reactance, X, of the grid impedance, Z, is derived in a fast and easy manner.

Furthermore, the method of the present invention allows the grid impedance to be derived, while taking dynamics into account, in the sense that dynamic behaviour of the power grid, locally with respect to the power generating unit, is taken into account. Such local dynamic behaviour may, e.g., be caused by other automatic voltage regulation AVR units. As renewable energy plants replace conventional power plants to an increasing extent, more local AVR units will be added, causing the power grid to have more and more dynamic behaviour on the voltage when injecting active power and reactive power. Full knowledge of the grid may be obtained, including static as well as dynamic behaviour. Thereby it is possible to obtain more accurate voltage control.

The step of determining the voltage, $V_{meas}$, across the point of interconnection; the active current, $I_P$, and/or the active power, P, delivered by the power generating unit to the power grid; and the reactive current, $I_Q$, and/or the reactive power, Q, delivered by the power generating unit to the power grid may comprise measuring the voltage, $V_{meas}$, the active current, $I_P$, the active power, P, the reactive current, $I_Q$ and/or the reactive power, Q. According to this embodiment, the determination of the voltage, $V_{meas}$, $I_P$ and/or P and $I_Q$ and/or Q, is performed by direct measurements. These measurements may be directly measured in the power grid, which is a fast and reliable manner of determining parameters. The measurements may, e.g., be performed by means of power meters, current transformers, phasor measurement units and watt-meters.

Alternatively, the measurements of voltage, $V_{meas}$, $I_P$ and/or P and $I_Q$ and/or Q, may be performed by indirect measurements, where $V_{meas}$, $I_P$ and/or P and $I_Q$ and/or Q, are not measured directly, but other related parameters may be measured and $V_{meas}$, $I_P$ and/or P and $I_Q$ and/or Q, may be derived therefrom.

The recursive adaptive filter algorithm may be a recursive least square algorithm. According to this embodiment, the recursive least square algorithm recursively finds the coefficients that minimise a weighted linear least square (weighted linear regression) cost function relating to one or more input signals. Similarly, the algorithm may provide one or more output signals. The recursive least square algorithm offers a fast and effective way of processing data.

Alternatively or additionally, the recursive adaptive filter algorithm may be a Kalman algorithm. According to this embodiment, the Kalman algorithm uses a series of measurements observed over time, and produces estimates of unknown variables by estimating a joint probability distribution over the variables for each timeframe. The Kalman algorithm offers a computationally efficient and fast way of processing data.

Alternatively or additionally, another recursive adaptive filter algorithm, such as a least mean squares algorithm or the like may be used. The least mean squares algorithm offers an estimation algorithm with low complexity and simple implementation.

The model representation of the power grid may be a state space representation. According to this embodiment, the state space representation of the grid is a mathematical model of the physical system as a set of input, output and state variables. The state space representation may be applicable to multiple input multiple output systems.

For instance, the step of creating a model representation of the power grid may comprise creating a state space representation of the form:

$$\dot{x}(t) = Ax(t)Bu(t)$$
$$y(t) = Cx(t) + Du(t), D = 0$$
$$\Downarrow$$
$$\begin{bmatrix} \dot{x}_1(t) \\ \dot{x}_2(t) \end{bmatrix} = \begin{bmatrix} a1 & a2 \\ a3 & a4 \end{bmatrix} \begin{bmatrix} x_1(t) \\ x_2(t) \end{bmatrix} + \begin{bmatrix} b1 & b2 \\ b3 & b4 \end{bmatrix} \begin{bmatrix} I_P(t) \\ I_Q(t) \end{bmatrix}$$
$$y(t) = \begin{bmatrix} c1 & c2 \end{bmatrix} \begin{bmatrix} x_1(t) \\ x_2(t) \end{bmatrix}, y(t) = V_Z(t) + V_{dyn}(t),$$

where A, B, C and D are matrixes, and the step of estimating a parameter estimation vector may comprise estimating parameters for the matrixes A, B, C and D.

According to this embodiment, u(t) represents input to the state space model, at time t, in the form of the active current, $I_P(t)$, and the reactive current, $I_Q(t)$, respectively, at time t. y(t) represents the output of the state space mode, at time t, in the form of the measured voltage, $V_{meas}(t)$. The voltage, $V_{meas}(t)$, comprises a static part, $V_Z(t)$, and a dynamic part, $V_{dyn}(t)$.

The matrix A represents dynamic behaviour of the system. The matrixes B and C represent gain response of the system, B being an input matrix and C being an output matrix. The matrix D represents feedforward of the system. According to this embodiment, D=0, i.e. the feedforward of the system is not taken into account. The estimation vector is, in this case, a list of values constituting the parameters of the matrixes, A, B, C and D, and thereby provides all necessary information required in order to described the system by means of the model representation.

The step of calculating a system DC gain vector may comprise applying the formula:

$$K_{DC} = D - CA^{-1}B,$$

where $K_{DC}$ is the system DC gain vector, and A, B, C and D are the matrixes of the state space representation.

According to this embodiment, once the parameters for the respective matrixes have been obtained in the form of the parameter estimation vector, the DC gain vector is calculated by means of simple matrix operations performed on the resulting matrixes. This is an easy calculation, and thereby the DC gain vector can be obtained fast and easy.

The method may further comprise the step of deriving a damping ratio, $\zeta$, and/or an oscillation frequency, $\omega_n$, for voltage dynamics of the power grid on the basis of the model representation of the power grid. According to this embodiment, the model representation of the power grid may further be used for deriving a damping ratio, $\zeta$, and/or an oscillation frequency, $\omega_n$, for voltage dynamics of the power grid.

The damping ratio, $\zeta$, describes the ability of a system to oppose the oscillatory nature of the system's transient response. Large values of damping ratios, $\zeta$, produce transient responses with lesser oscillatory nature. Similarly, lower values of damping ratios, $\zeta$, produce transient responses with higher oscillatory nature. A system with a damping ratio, $\zeta$, may be undamped ($\zeta=0$), underdamped ($\zeta<1$), critically damped ($\zeta=1$) or overdamped ($\zeta>1$).

The oscillation frequency, $\omega_n$, for the voltage dynamics describes the frequency at which the voltage dynamics oscillate. The damping ratio, $\zeta$, and/or the oscillation frequency, $\omega_n$, is/are derived on the basis of the model representation of the power grid. Eigenvalue analysis of the model representation of the power grid may be used for deriving the damping ratio, $\zeta$, and/or the oscillation frequency, $\omega_n$. Eigenvalues are a set of scalars associated with a linear system of equations, i.e. a matrix equation, that are generally known as characteristic values or characteristic roots.

Thus, according to this embodiment, information regarding the dynamics of the power grid is obtained. The information regarding the dynamics of the power grid may be used for gaining knowledge regarding the transient period of the voltage dynamics, how much the voltage dynamics are damped, and when the voltage dynamics reach steady state. Moreover, an oscillating voltage, $V_{dyn}$, indicating an amplitude of the voltage dynamics may be estimated from the derived damping ratio, $\zeta$, and oscillation frequency, on.

The obtained information may further be used for controlling the determined voltage, $V_{meas}$, across the point of interconnection. The power grid may have a nominal voltage, $V_n$, an oscillating voltage $V_{dyn}$ and a voltage across the grid impedance, $V_Z$.

The determined voltage, $V_{meas}$, across the point of interconnection may be expressed as the sum of the voltages of the power grid, such that $V_{meas} = V_{dyn} + V_n + V_Z$. By obtaining information regarding the dynamics (damping ratio, $\zeta$, and oscillation frequency, $\omega_n$), the oscillating voltage, $V_{dyn}$, can be derived. The nominal voltage, $V_n$, is normally provided by the grid operator. Accordingly, by determining $V_{meas}$ and deriving $V_{dyn}$ in the manner described above, the voltage across the grid impedance, $V_Z$, can be derived. Then the grid impedance, Z, can easily be derived, using Ohm's law, and based on the derived voltage, $V_Z$, and the determined currents, $I_P$ and $I_Q$.

Furthermore, the obtained information may be used for providing adaptive voltage control of the power generating unit which takes changes in grid impedance, Z, resistance, R, reactance, X, oscillation frequency, $\omega_n$, and/or damping ratio, $\zeta$, into account. Thereby the voltage, active current, $I_P$, and/or reactive current, $I_Q$, provided by the power generating unit to the power grid can be controlled in order to handle such changes, e.g. damping the changes in the dynamics in the system.

The voltage dynamics of the power grid may comprise machine dynamics in the power grid. According to this embodiment, the machine dynamics may be a component originating from an electromechanical generator in the power grid. Alternatively or additionally, the voltage dynamics may comprise dynamics arising from other voltage regulation mechanisms in the power grid. This could, e.g., include an automatic voltage regulation (AVR) unit at another power plant located nearby.

The step of deriving the grid impedance, Z, and/or the resistance, R, of the grid impedance, Z, and/or the reactance, X, of the grid impedance, Z, may comprise deriving an X/R ratio on the basis of the resistance, R, and the reactance, X, of the grid impedance, Z. According to this embodiment, the X/R ratio is the ratio of the imaginary part, X, of the complex grid impedance, Z, representing a reactive part of the complex grid impedance, Z, and the real part, R, of the complex grid impedance, Z, representing a resistive part of the complex grid impedance, Z. Thus, the grid impedance, Z, itself may not necessarily be derived according to this embodiment.

The X/R ratio may have an impact on the level of short circuit current a circuit breaker is required to interrupt. A circuit breaker is an automatic device for stopping the flow of current in an electric circuit as a safety measure. The X/R ratio may further be used as a design factor for transformers in the power grid.

The power generating unit may form part of a renewable power plant, and the method may further comprise the step of controlling the power generating unit to provide a power feed into the power grid based on the estimated grid impedance, Z, and/or the resistance, R, of the grid impedance, Z, and/or the reactance, X, of the grid impedance, Z. According to this embodiment, the power generating unit forms part of a renewable power plant which comprises one or more renewable power generating units, such as wind turbines, photovoltaic cells, etc. The power generating unit may, thus, be such a renewable power generating unit.

Furthermore, according to this embodiment, the method further comprises the step of controlling the power generating unit to provide power feed into the power grid, based on the estimated grid impedance, Z, resistance, R, and/or reactance, X. Thus, the power generating unit is controlled in such a manner that the power which is actually fed to the power grid by the power generating unit is in accordance with the grid impedance, Z, and thereby the power delivered by the power generating unit to the power grid can easily be adapted to follow any changes in the grid impedance.

The step of controlling the power generating unit to provide a power feed into the power grid may be performed by controlling ramp rates of an active power feed and/or a reactive power feed in relation to the estimated grid impedance, Z, and/or the resistance, R, of the grid impedance, Z, and/or the reactance, X, of the grid impedance, Z. The step of controlling ramp rates of the active power feed and/or the reactive power feed from the power generating unit may, e.g., be performed by having gains on an active power generation and a reactive power generation of the power generating unit depending on the estimated grid impedance, Z, and/or the resistance, R, of the grid impedance, Z, and/or the reactance, X, of the grid impedance, Z.

Alternatively, a look-up table may be used for controlling the active power feed and/or the reactive power feed dependent on the estimated grid impedance, Z, and/or the resistance, R, of the grid impedance, Z, and/or the reactance, X, of the grid impedance, Z.

The step of controlling the power generating unit may comprise controlling the active current, $I_P$, and/or the active power, P, delivered by the power generating unit to the power grid; and the reactive current, $I_Q$, and/or the reactive power, Q, delivered by the power generating unit to the power grid. According to this embodiment, the power provided to the power grid by the power generating unit is controlled based on the estimated grid impedance, Z, resistance, R, and/or reactance, X.

Thus, the power generating unit is controlled in such a manner that the active current, $I_P$, and/or the active power, P; and the reactive current, $I_Q$, and/or the reactive power, Q, which is actually fed to the power grid by the power generating unit is in accordance with the grid impedance, Z, resistance, R, and/or reactance, X. Thereby, the active current, $I_P$, and/or the active power, P; and the reactive current, $I_Q$, and/or the reactive power, Q, delivered by the power generating unit to the power grid may be easily adapted to follow any changes in the grid impedance, Z, resistance, R, and/or reactance, X.

The step of controlling the active current, $I_P$, and/or the active power, P, delivered by the power generating unit to the power grid; and the reactive current, $I_Q$, and/or the reactive power, Q, delivered by the power generating unit to the power grid may be performed by having gains on an active power generation and a reactive power generation of the power generating unit dependent on the estimated grid impedance, Z, and/or the resistance, R, of the grid impedance, Z, and/or the reactance, X, of the grid impedance, Z.

Alternatively or additionally, the gains on an active power generation and a reactive power generation of the power generating unit may be dependent on other system parameters, such as the determined voltage, $V_{meas}$, across the point of interconnection and/or a power grid frequency.

The power generating unit may be a wind turbine generator. According to this embodiment, the power generating unit is a renewable power generating unit in the form of a wind turbine. The wind turbine may be a stand alone wind turbine, or it may form part of a wind farm comprising two or more wind turbines. Alternatively, the power generating unit may be in the form of another kind of renewable power generating unit, such as one or more photovoltaic cells, a hydroelectric generator, etc.

The step of deriving the grid impedance, Z, and/or the resistance, R, of the grid impedance, Z, and/or the reactance, X, of the grid impedance, Z, may comprise deriving an absolute value of the grid impedance, |Z|, using the formula:

$$|Z|=R^2+X^2.$$

According to this embodiment, the absolute value of the grid impedance, Z, is derived as the square root of the resistance, R, of the grid impedance, Z, squared plus the reactance, X, of the grid impedance, Z, squared.

The method may further comprise the step of determining a short circuit ratio, SCR=1/|Z|, as the inverse of the absolute value of the grid impedance, |Z|. According to this embodiment, a short circuit ratio is derived. The short circuit ratio is a measure of the stability of an electromechanical generator. The short circuit ratio is the ratio of field current required to produce rated armature voltage at open circuit to the field current required to produce the rated armature current under three phase short circuit condition. The SCR is an easy and reliable manner of representing the operating characteristics of the electromechanical generator. Thus, the derived SCR may be used for determining whether or not the power grid is stable, and this may, in turn, be used for determining whether or not to apply appropriate measures in this regard.

An angle, θ, of the grid impedance, Z, may be derived on the basis of the resistance, R, and the reactance, X, of the grid impedance, Z, using the formula:

$$\theta = \tan^{-1}\left(\frac{X}{R}\right).$$

According to this embodiment, the angle, θ, is derived as the inverse tangent of the X/R ratio. The angle, θ, of the grid impedance, Z, may be used for representing the grid impedance, Z, in another mathematical form, which does not specify the resistance, R, and the reactance, X. Assuming that the absolute value of the grid impedance, |Z|, and the angle, θ, of the grid impedance, Z, is known, the grid impedance may be represented in the following mathematical form:

Z=|Z|∠θ=|Z|(cos θ+j sin θ)=|Z|e^{jθ}.

According to a second aspect, the invention provides a renewable power plant comprising a plurality of power generating units, coupled to a power grid at a point of interconnection, wherein at least one of the power generating units is adapted to provide a power feed into the power grid, based on a grid impedance, Z, a resistance, R, of a grid impedance, Z, and/or a reactance, X, of a grid impedance, Z, wherein the grid impedance, Z, the resistance, R, and/or the reactance, X, have been estimated in accordance with a method according to the first aspect of the invention.

Thus, according to the second aspect, the invention provides a renewable power plant comprising a plurality of power generating units coupled to a power grid at a point of interconnection. At least one of the power generating units is adapted to provide a power feed into the power grid, based on a grid impedance, Z, a resistance, R, of a grid impedance, Z, and/or a reactance, X, of a grid impedance, Z. The grid impedance, Z, the resistance, R, of the grid impedance, Z, and/or the reactance, X, of the grid impedance, Z, have been estimated in accordance with a method according to the first aspect of the invention, i.e. in the manner described above. Accordingly, the remarks set forth above with reference to the first aspect of the invention are equally applicable here.

Thus, the renewable power plant according to the second aspect of the invention is configured to provide a power feed into the power grid which is in accordance with the grid impedance, Z, the resistance, R, of the grid impedance, Z, and/or the reactance, X, of the grid impedance, Z, for the reasons set forth above with reference to the first aspect of the invention. Thus, the power delivered by the renewable power plant to the power grid can easily be adapted to follow any changes in the grid impedance.

It is an advantage that the at least one power generating unit of the renewable power plant is adapted to provide a power feed based on the estimated grid impedance, Z, the resistance, R, of the grid impedance, Z, and/or the reactance, X, of a grid impedance, Z, wherein the estimation is in accordance with the method according to the first aspect of the invention, because thereby the power feed can be controlled in a manner which closely follows any changes in the grid impedance, Z. This coherence between the power feed of the plurality of power generating units and the estimated grid impedance, Z, resistance, R and/or reactance, X, enables the renewable power plant to provide a power feed which is precise in a reliable manner.

Moreover, the coherence between the power feed of the plurality of power generating units and the estimated grid impedance, Z, resistance, R and/or reactance, X, further enables the renewable power plant to be capable of adapting a power feed to a power grid according to changes of the grid impedance in a fast and accurate manner, because the grid impedance, Z, resistance, R, and/or reactance, X, is/are determined in a fast and reliable manner, as described above, and therefore the power generating unit is capable of reacting fast to any changes in the grid impedance, Z.

The power generating unit may be a wind turbine generator. According to this embodiment, the power generating unit is a renewable power generating unit in the form of a wind turbine. Alternatively, the power generating unit may be in the form of another kind of renewable power generating unit such as, one or more photovoltaic cells, a hydroelectric generator, etc.

The renewable power plant may comprise a plurality of wind turbines. Alternatively or additionally, the renewable power plant may comprise one or more alternative kinds of renewable power generators, such as photovoltaic cells, a hydroelectric generator, battery storages, etc.

BRIEF DESCRIPTION OF THE DRAWINGS

The invention will now be described in further details with reference to the accompanying drawings, in which.

DETAILED DESCRIPTION OF THE DRAWINGS

Figure 1:
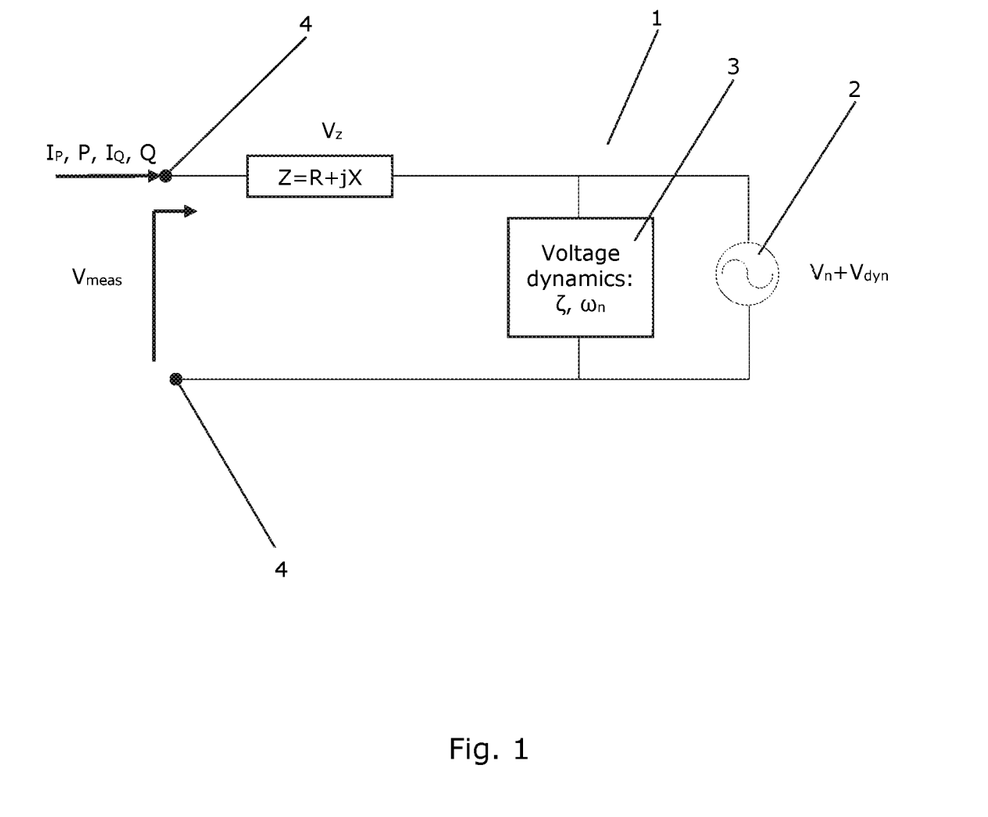
FIG. 1 is a schematic diagram illustrating a power grid comprising a voltage source and a grid impedance, Z, which is estimated using a method according to an embodiment of the invention.

FIG. 1 is a schematic diagram illustrating a power grid 1 comprising a voltage source 2 and a grid impedance, Z. The voltage source 2 has a voltage as a sum of the voltages, $V_n$ and $V_{dyn}$, wherein $V_n$ is a nominal voltage normally provided by a grid operator, and $V_{dyn}$ represents an oscillating voltage related to voltage dynamics 4 of the power grid 1.

The grid impedance, Z, is of the complex form Z=R+jX, wherein R is a real part of the grid impedance, Z, representing a resistive part of the grid impedance, Z. Similarly, X is an imaginary part of the grid impedance, Z, representing a reactive part of the grid impedance, Z. Thereby the grid impedance, Z, is represented by a resistance, R, and a reactance, X. There is a voltage, $V_Z$, across the grid impedance, Z.

The voltage dynamics 3 of the power grid 1 are represented by an oscillation frequency, $\omega_n$, and a damping ratio, ζ. The damping ratio, describes the ability of a system to oppose the oscillatory nature of the system's transient response. Furthermore, the oscillation frequency, $\omega_n$, describes the frequency at which the voltage dynamics 3 oscillate. Thus, the voltage dynamics 3 of the power grid 1 may be used for gaining knowledge of the transient period of the voltage dynamics 3, how much the voltage dynamics 3 are damped, and when the voltage dynamics 3 reach steady state. Moreover, the oscillating voltage, $V_{dyn}$, indicates an amplitude of the voltage dynamics. Thus, $V_{dyn}$ could, e.g., be estimated from the damping ratio, ζ, and oscillation frequency, $\omega_n$.

A voltage, $V_{meas}$, is determined across a point of interconnection 4, e.g. by direct measurement. The point of interconnection 4 is the physical interface between the power grid 1 and a power generating unit (not shown) which delivers power to the power grid 1. Thereby the voltage, $V_{meas}$, is a measure of the voltage between the power grid 1 and the rest of the power system, notably the power generating unit. The voltage, $V_{meas}$, can further be represented as the sum of all voltages of the power grid 1, i.e. $V_{meas}=V_{dyn}+V_n+V_z$.

Furthermore, an active current, $I_P$, and/or an active power, P, delivered by the power generating unit to the power grid 1 is/are determined, e.g. by direct measurement. Further, a reactive current, $I_Q$, and/or a reactive power, Q, delivered by the power generating unit to the power grid 1 is/are also determined, e.g. by direct measurement. The active current, $I_P$, as well as the active power, P, represents the active part of the power which the power generating unit provides to the power grid 1. Similarly, the reactive current, $I_Q$, as well as the reactive power, Q, represents the reactive part of the power which the power generating unit provides to the power grid 1.

Thus, information regarding the voltage across the point of interconnection 4, in the form of $V_{meas}$, the active power provided by the power generating unit, in the form of $I_P$ and/or P, and the reactive power provided by the power generating unit, in the form of $I_Q$ and/or Q, is now available.

The voltage, $V_{meas}$, and the active current, $I_P$, and/or the active power, P; and the reactive current, $I_Q$, and/or reactive power, Q, are then used for estimating the grid impedance, Z. This could, e.g., include estimating the grid impedance, Z, itself, and/or estimating the resistance, R, and/or the reactance, X. This could, e.g., be done in the following manner.

The oscillating voltage, $V_{dyn}$, is derived on the basis of the voltage dynamics 3, and the nominal voltage, $V_n$, is provided by the grid operator. Then the voltage, $V_Z$, across the grid impedance, Z, is calculated from the measured voltage, $V_{meas}$, as $V_Z=V_{meas}-V_n-V_{dyn}$. Finally, the grid impedance, Z, can be estimated by applying Ohm's Law and using $V_Z$ and the determined active current, $I_P$, and/or active power, P; and the determined reactive current, $I_Q$, and/or reactive power, Q.

Figure 2:
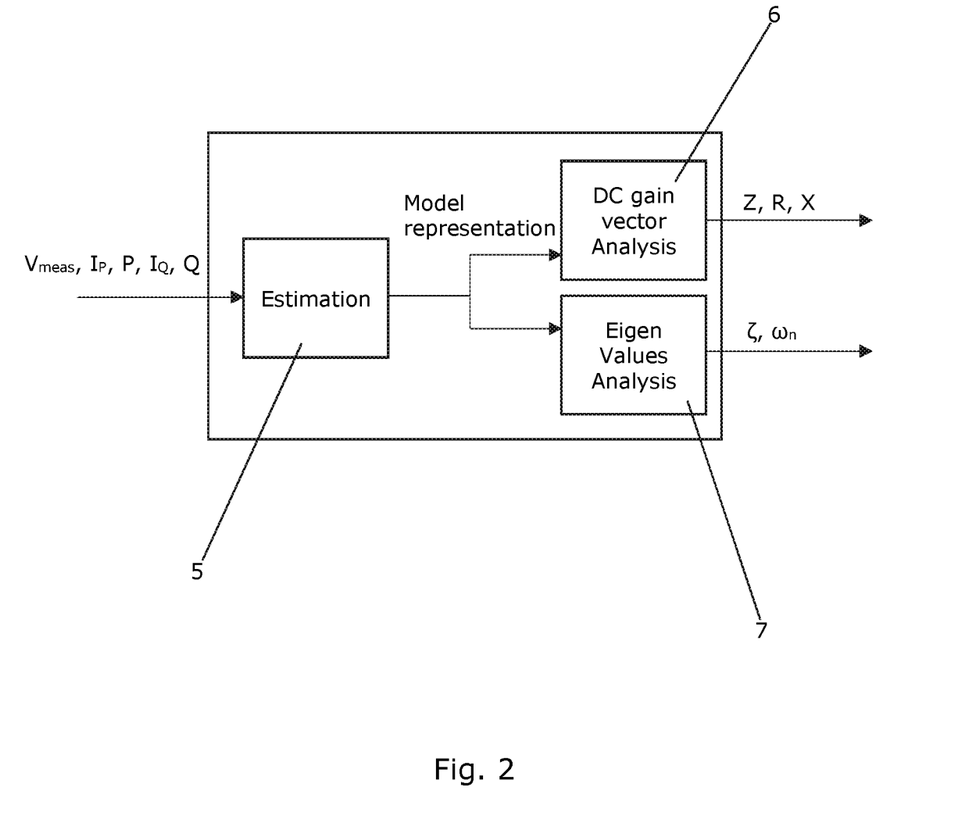
FIG. 2 is a block diagram illustrating a method according to an embodiment of the invention.

FIG. 2 is a block diagram illustrating a method according to an embodiment of the invention. A number of input parameters, in the form of $V_{meas}$, $I_P$, P, $I_Q$, and/or Q, which have previously been determined, e.g. in the manner described above with reference to FIG. 1, are fed to an estimator 5.

In the estimator 5, a parameter estimation vector is estimated, based on the input parameters, and using a recursive adaptive filter algorithm, such as a recursive least square algorithm and/or a Kalman algorithm. The parameter estimation vector defines a set of estimated model parameters for a selected model of system response of the power grid. Furthermore, the estimator 5 creates a model representation based on the selected model and the parameter estimation vector, by applying the set of parameters of the parameter estimation vector to the selected model. The model representation is a state space representation of the power grid, which is a mathematical model of the physical system as a set of input, output and state variables. Thus, the model representation depends on the parameter estimation vector, and thereby on changes in voltage and current and/or power parameters which formed the basis of the parameter estimation vector.

The estimator 5 outputs the model representation, which is used as an input to DC gain vector analyser 6 and an Eigen values analyser 7.

The DC gain vector analyser 6 calculates a DC gain vector for the power grid 1, using the model representation. Thus, changes in the model representation will be reflected in the calculated DC gain vector. Accordingly, changes in the determined voltage, current and/or power parameters are also reflected in the DC gain vector. The DC gain vector represents a correlation between voltage, on the one hand, and active and reactive power in the other hand, when the power grid is in a steady state.

The DC gain vector analyser 6 uses the DC gain to derive a grid impedance, Z, and/or a resistance, R, of the grid impedance, Z, and/or a reactance, X, of the grid impedance, Z, from the DC gain vector. For this reason, any changes in the calculated DC gain vector and in the determined voltage, current and/or power parameters will be reflected in the derived grid impedance, Z, and/or a resistance, R, of the grid impedance, Z, and/or a reactance, X, of the grid impedance, Z. Furthermore, this is an easy and fast manner of estimating the grid impedance, and accordingly the system may react fast to any changes in the grid impedance.

The derived grid impedance, Z, resistance, R, and/or a reactance, X, may further be used for deriving a short circuit ratio (SCR) of the power grid 1, a X/R ratio, an absolute value of the grid impedance, |Z|, and an angle, θ, of the grid impedance, Z.

The Eigen values analyser 7 derives a damping ratio, ζ, and an oscillation frequency, $\omega_n$, on the basis of the model representation. The damping ratio, ζ, and the oscillation frequency, $\omega_n$, represent the voltage dynamics 4 of the power grid 1, and could, e.g., be used for estimating an oscillating voltage, $V_{dyn}$, of the power source 2 of the power grid 1, as described above with reference to FIG. 1.

Thus, based on the input parameters $V_{meas}$, $I_P$, P, $I_Q$, and/or Q, an estimation is performed by the estimator 8. The estimator 8 estimates a parameter estimation vector and creates a model representation based on the parameter estimation vector. The model representation is used as an input to the DC gain vector analyser 6 and the Eigen values analyser 7.

Figure 3:
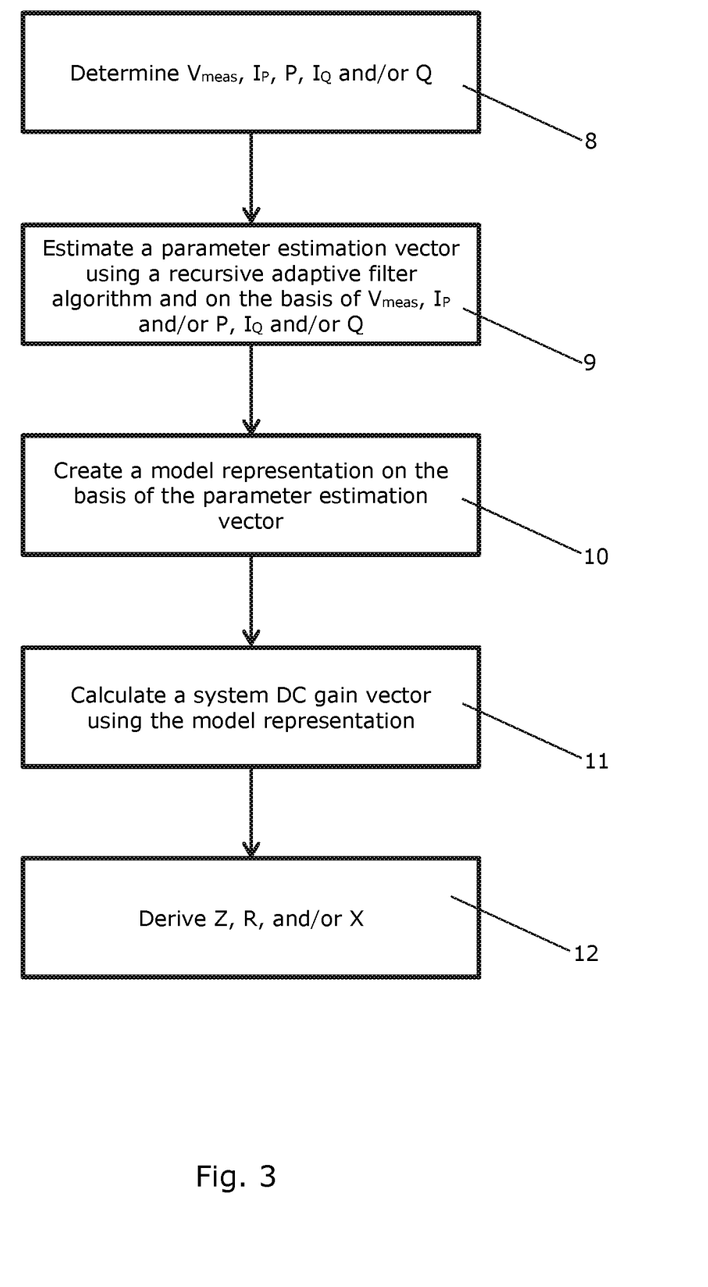
FIG. 3 is a flow chart illustrating a method according to an embodiment of the invention.

FIG. 3 is a flow chart illustrating a method according to an embodiment of the invention. The method is initiated by a first step 8, in which a voltage, $V_{meas}$, an active current, $I_P$, and/or an active power, P; and a reactive current, $I_Q$, and/or a reactive power, Q, are determined. $V_{meas}$, $I_P$, and/or P; and $I_Q$, and/or Q may be determined in the manner described above with reference to FIG. 1.

In a second step 9, a parameter estimation vector is estimated using a recursive adaptive filter algorithm, such as a recursive least square algorithm or a Kalman algorithm, and on the basis of $V_{meas}$, $I_P$, and/or P; and $I_Q$, and/or Q, e.g. in the manner described above with reference to FIG. 2.

In a third step 10, a model representation is created on the basis of the parameter estimation vector, e.g. in the manner described above with reference to FIG. 2.

In a fourth step 11, the model representation is used for calculating a system DC gain vector, e.g. in the manner described above with reference to FIG. 2.

In a fifth step 12, a grid impedance, Z, and/or a resistance, R, of the grid impedance, Z, and/or a reactance, X, of the grid impedance, Z, is derived, e.g. in the manner described with reference to FIGS. 1 and 2.

Figure 4:
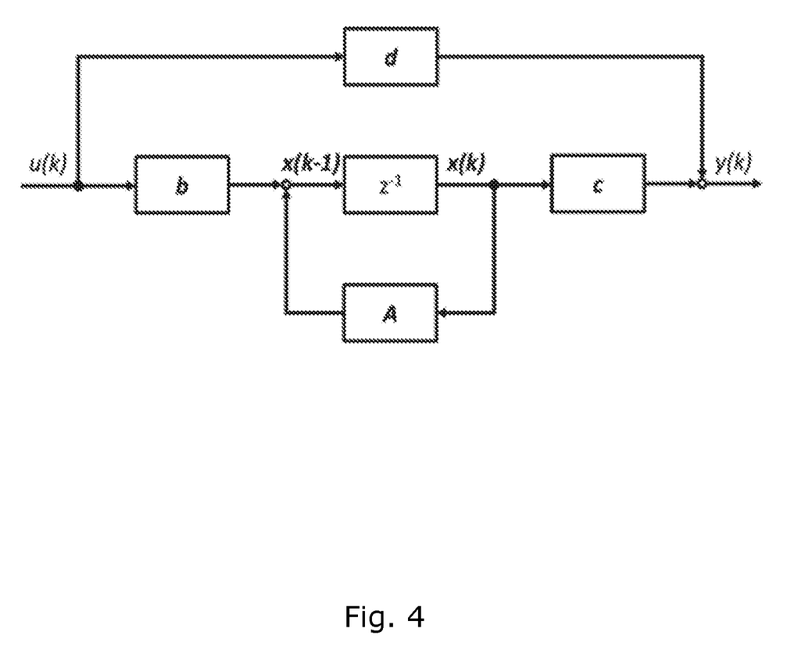
FIG. 4 is a block diagram illustrating a state space model for use in a method according to an embodiment of the invention.

FIG. 4 is a block diagram illustrating a state space model for use in a method according to an embodiment of the invention, in the form of a multiple input, single output model. An input, u(k), representing active and reactive current of the system, is input to the state space model, and an output, y(k), representing voltage, $V_{meas}$, is output by the state space model. A, B, C and D represent static and dynamic behaviour of the system, and may be in the form of suitable matrixes. A parameter estimation vector defines parameters to be applied to the matrixes in order to create a model representation of the actual power grid.

The model representation of FIG. 4 is of the form:

$$\dot{x}(t) = Ax(t)Bu(t)$$

$$y(t) = Cx(t) + Du(t), D = 0$$

⇓

$$\begin{bmatrix} \dot{x}_1(t) \\ \dot{x}_2(t) \end{bmatrix} = \begin{bmatrix} a1 & a2 \\ a3 & a4 \end{bmatrix} \begin{bmatrix} x_1(t) \\ x_2(t) \end{bmatrix} + \begin{bmatrix} b1 & b2 \\ b3 & b4 \end{bmatrix} \begin{bmatrix} I_P(t) \\ I_Q(t) \end{bmatrix}$$

$$y(t) = \begin{bmatrix} c1 & c2 \end{bmatrix} \begin{bmatrix} x_1(t) \\ x_2(t) \end{bmatrix}, y(t) = V_Z(t) + V_{dyn}(t)$$

The matrix A represents dynamics of the system, the matrixes B and C represent gain of the system, B being an input matrix and C being an output matrix, and the matrix D represents feedforward of the system, which may be set to zero and thereby not taken into account.

The invention claimed is:

1. A method for estimating components of a grid impedance (Z) of a power grid coupled to a power generating unit at a point of interconnection, the method comprising:
   determining (i) a voltage across the point of interconnection, (ii) an active current or an active power delivered by the power generating unit to the power grid, and (iii) a reactive current or a reactive power delivered by the power generating unit to the power grid;
   estimating a parameter estimation vector using a recursive adaptive filter algorithm and based on (i) the determined voltage, (ii) the determined active current or active power, and (iii) the reactive current or the reactive power, the parameter estimation vector defining a set of estimated model parameters for a selected model of system response of the power grid;
   creating a model representation of the power grid based on the parameter estimation vector, and by applying the set of parameters of the parameter estimation vector to the selected model;
   calculating a system direct current (DC) gain vector for the power grid using the model representation, the DC gain vector representing a correlation between voltage and (i) active current or active power or (ii) reactive current or reactive power at steady state of the power grid;
   deriving (i) the grid impedance, (ii) a resistance (R) of the grid impedance, or (iii) a reactance (X) of the grid impedance from the system DC gain vector, where Z=R+jX; and
   controlling the power generating unit to provide a power feed into the power grid based on the estimated grid impedance, the resistance of the grid impedance, or the reactance of the grid impedance.

2. The method of claim 1, wherein the determining (i) the voltage across the point of interconnection, (ii) the active current or the active power delivered by the power generating unit to the power grid, and (iii) the reactive current or the reactive power delivered by the power generating unit to the power grid comprises measuring (i) the voltage, (ii) the active current or, the active power, and (iii) the reactive current or the reactive power.

3. The method of claim 1, wherein the recursive adaptive filter algorithm is a recursive least square algorithm.

4. The method of claim 1, wherein the recursive adaptive filter algorithm is a Kalman algorithm.

5. The method of claim 1, wherein the model representation of the power grid is a state space representation.

6. The method of claim 1, further comprising the step of deriving a damping ratio or an oscillation frequency for voltage dynamics of the power grid based on the model representation of the power grid.

7. The method of claim 6, wherein the voltage dynamics of the power grid comprises machine dynamics in the power grid.

8. The method of claim 1, wherein the deriving the grid impedance, the resistance of the grid impedance, or the reactance of the grid impedance comprises deriving an X/R ratio.

9. The method of claim 1, wherein the power generating unit forms part of a renewable power plant.

10. The method of claim 9, wherein the controlling the power generating unit comprises controlling (i) the active current or the active power delivered by the power generating unit to the power grid and (ii) the reactive current or the reactive power delivered by the power generating unit to the power grid.

11. The method of claim 1, wherein the power generating unit is a wind turbine generator.

12. The method of claim 1, wherein the deriving the grid impedance, the resistance of the grid impedance, or the reactance of the grid impedance comprises deriving an absolute value of the grid impedance (|Z|) using a formula:

$$|Z| = \sqrt{R^2 + X^2}.$$

13. The method of claim 1, wherein an angle (θ) of the grid impedance is derived based on the resistance and the reactance of the grid impedance using a formula:

$$\theta = \tan^{-1}\left(\frac{X}{R}\right).$$

14. A renewable power plant comprising a plurality of power generating units, coupled to a power grid at a point of interconnection, wherein at least one of the power generating units is adapted to provide a power feed into the power grid based on a grid impedance (Z), a resistance (R) of the grid impedance or a reactance (X) of the grid impedance, wherein the grid impedance, the resistance or the reactance have been estimated in accordance with an operation of estimating components of the grid impedance of the power grid, the renewable power plant configured to perform an operation comprising:
   determining (i) a voltage across the point of interconnection, (ii) an active current or an active power delivered by the power generating unit to the power grid, and (iii) a reactive current or a reactive power delivered by the power generating unit to the power grid;
   estimating a parameter estimation vector using a recursive adaptive filter algorithm, and based on (i) the determined voltage, (ii) the determined active current or active power, and (iii) the reactive current or the reactive power, the parameter estimation vector defining a set of estimated model parameters for a selected model of system response of the power grid;
   creating a model representation of the power grid based on the parameter estimation vector, and by applying the set of parameters of the parameter estimation vector to the selected model;
   calculating a system direct current (DC) gain vector for the power grid using the model representation, the DC gain vector representing a correlation between voltage and (i) active current or active power or (ii) reactive current or reactive power at steady state of the power grid;

deriving (i) the grid impedance, the resistance of the grid impedance, or the reactance of the grid impedance from the system DC gain vector, where $Z=R+jX$; and controlling the power generating unit to provide the power feed into the power grid based on the estimated grid impedance, the resistance of the grid impedance, or the reactance of the grid impedance.

15. A renewable power plant according to claim 14, wherein the at least one power generating unit is a wind turbine generator.

\* \* \* \* \*